United States Patent
Goldberg et al.

(10) Patent No.: US 7,053,198 B2
(45) Date of Patent: May 30, 2006

(54) FUNCTIONATED PHOTOACID GENERATOR AND FUNCTIONATED POLYMER SYSTEM FOR BIOLOGICAL MICROARRAY SYNTHESIS

(75) Inventors: Martin Goldberg, Saratoga, CA (US); Guangyu Xu, Sunnyvale, CA (US)

(73) Assignee: Affymetrix, Inc., Santa Clara, CA (US)

( * ) Notice: Subject to any disclaimer, the term of this patent is extended or adjusted under 35 U.S.C. 154(b) by 0 days.

(21) Appl. No.: 10/313,652

(22) Filed: Dec. 6, 2002

(65) Prior Publication Data
US 2004/0109935 A1 Jun. 10, 2004

(51) Int. Cl.
*C07H 21/00* (2006.01)
*C07H 21/02* (2006.01)
*C07H 21/04* (2006.01)

(52) U.S. Cl. .................. 536/23.1; 536/25.3; 435/6
(58) Field of Classification Search .............. 536/23.1, 536/25.3; 435/6
See application file for complete search history.

(56) References Cited

U.S. PATENT DOCUMENTS

| 5,527,656 A | * | 6/1996 | Imai et al. ............... 430/288.1 |
| 6,426,184 B1 | * | 7/2002 | Gao et al. ...................... 435/6 |
| 6,660,479 B1 | * | 12/2003 | Kim et al. ..................... 435/6 |

OTHER PUBLICATIONS

Singh-Gasson et al. "Maskless fabrication of light-directed oligonucleotide microarrays using a digital micromirror array" Nature Biotechnology vol. 17, Oct. 1999, pp. 974-978.*

* cited by examiner

*Primary Examiner*—Jezia Riley
(74) *Attorney, Agent, or Firm*—Wei Zhou; Thomas E. Malone; Leticia R. Block

(57) ABSTRACT

In some embodiment of the invention, methods are provided for the synthesis of polymer arrays. In one embodiment, a reactive polymer and a photo acid generator is used for the photodirected polymer array synthesis.

7 Claims, 2 Drawing Sheets

FUNCTIONATED PHOTOACID GENERATOR AND FUNCTIONATED POLYMER SYSTEM FOR BIOLOGICAL MICROARRAY SYNTHESIS

BACKGROUND OF THE INVENTION

This invention is related to the manufacturing of polymer arrays.

Polymer arrays, such as the DNA microarrays, have extensive practical applications in, for example, drug discovery and medical diagnostics. Therefore, there is a need in the art for additional methods for manufacturing polymer arrays.

SUMMARY OF THE INVENTION

In one aspect of the invention, a method for making polymer arrays is provided. An exemplary method includes the steps of coating a substrate with a reactive polymer matrix and a photo carboxylic acid generator; b) exposing the substrate with patterned radiation to remove acid labile protecting group in reaction areas; d) coupling a monomer into the reaction areas. The reaction areas are exposed to radiation to generate acids that is useful for removing acid labile protecting groups. The radiation pattern may be generated using using a photomask or through a maskless exposure using digital micromirrors or GLV™ light valves.

In some embodiments, the steps are repeated to generate desired polymers in specific locations of the substrate. For example, oligonucleotide probes may be synthesized via phosphoramidite chemistry and with trityl ether as a protecting group.

The reactive polymer contains an acid labile function group that generates acid for removing acid labile protecting groups.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

The present invention has many preferred embodiments and relies on many patents, applications and other references for details known to those of the art. Therefore, when a patent, application, or other reference is cited or repeated below, it should be understood that it is incorporated by reference in its entirety for all purposes as well as for the proposition that is recited.

I. General

As used in this application, the singular form "a," "an," and "the" include plural references unless the context clearly dictates otherwise. For example, the term "an agent" includes a plurality of agents, including mixtures thereof.

An individual is not limited to a human being but may also be other organisms including but not limited to mammals, plants, bacteria, or cells derived from any of the above.

Throughout this disclosure, various aspects of this invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

The practice of the present invention may employ, unless otherwise indicated, conventional techniques and descriptions of organic chemistry, polymer technology, molecular biology (including recombinant techniques), cell biology, biochemistry, and immunology, which are within the skill of the art. Such conventional techniques include polymer array synthesis, hybridization, ligation, and detection of hybridization using a label. Specific illustrations of suitable techniques can be had by reference to the example herein below. However, other equivalent conventional procedures can, of course, also be used. Such conventional techniques and descriptions can be found in standard laboratory manuals such as Genome Analysis: A Laboratory Manual Series (Vols. I–IV), Using Antibodies: A Laboratory Manual, Cells: A Laboratory Manual, PCR Primer: A Laboratory Manual, and Molecular Cloning: A Laboratory Manual (all from Cold Spring Harbor Laboratory Press), Stryer, L. (1995) Biochemistry (4th Ed.) Freeman, New York, Gait, "Oligonucleotide Synthesis: A Practical Approach" 1984, IRL Press, London, Nelson and Cox (2000), Lehninger, Principles of Biochemistry 3rd Ed., W.H. Freeman Pub., New York, N.Y. and Berg et al. (2002) Biochemistry, 5th Ed., W.H. Freeman Pub., New York, N.Y., all of which are herein incorporated in their entirety by reference for all purposes.

The present invention can employ solid substrates, including arrays in some preferred embodiments. Methods and techniques applicable to polymer (including protein) array synthesis have been described in U.S. Ser. No. 09/536,841, WO 00/58516, U.S. Pat. Nos. 5,143,854, 5,242,974, 5,252, 743, 5,324,633, 5,384,261, 5,405,783, 5,424,186, 5,451,683, 5,482,867, 5,491,074, 5,527,681, 5,550,215, 5,571,639, 5,578,832, 5,593,839, 5,599,695, 5,624,711, 5,631,734, 5,795,716, 5,831,070, 5,837,832, 5,856,101, 5,858,659, 5,936,324, 5,968,740, 5,974,164, 5,981,185, 5,981,956, 6,025,601, 6,033,860, 6,040,193, 6,090,555, 6,136,269, 6,269,846 and 6,428,752, in PCT Applications Nos. PCT/US99/00730 (International Publication Number WO 99/36760) and PCT/US01/04285, which are all incorporated herein by reference in their entirety for all purposes.

Patents that describe synthesis techniques in specific embodiments include U.S. Pat. Nos. 5,412,087, 6,147,205, 6,262,216, 6,310,189, 5,889,165, and 5,959,098. Nucleic acid arrays are described in many of the above patents, but the same techniques are applied to polypeptide arrays which are also described.

Nucleic acid arrays that are useful in the present invention include those that are commercially available from Affymetrix (Santa Clara, Calif.) under the brand name GeneChip®. Example arrays are shown on the website at affymetrix.com. The present invention also contemplates many uses for polymers attached to solid substrates. These uses include gene expression monitoring, profiling, library screening, genotyping and diagnostics. Gene expression monitoring, and profiling methods are shown in U.S. Pat. Nos. 5,800,992, 6,013,449, 6,020,135, 6,033,860, 6,040,138, 6,177,248 and 6,309,822. Genotyping and uses therefore are shown in U.S. Ser. No. 60/319,253, 10/013,598, and U.S. Pat. Nos. 5,856,092, 6,300,063, 5,858,659, 6,284,460, 6,361,947, 6,368,799 and 6,333,179. Other uses are embodied in U.S. Pat. Nos. 5,871,928, 5,902,723, 6,045,996, 5,541,061, and 6,197,506.

The present invention also contemplates sample preparation methods in certain preferred embodiments. Prior to or concurrent with genotyping, the genomic sample may be amplified by a variety of mechanisms, some of which may employ PCR. See, e.g., PCR Technology: Principles and Applications for DNA Amplification (Ed. H. A. Erlich, Freeman Press, NY, N.Y., 1992); PCR Protocols: A Guide to Methods and Applications (Eds. Innis, et al., Academic Press, San Diego, Calif., 1990); Mattila et al., Nucleic Acids Res. 19, 4967 (1991); Eckert et al., PCR Methods and Applications 1, 17 (1991); PCR (Eds. McPherson et al., IRL Press, Oxford); and U.S. Pat. Nos. 4,683,202, 4,683,195, 4,800,159 4,965,188, and 5,333,675, and each of which is incorporated herein by reference in their entireties for all purposes. The sample may be amplified on the array. See, for example, U.S. Pat. No. 6,300,070 and U.S. patent application Ser. No. 09/513,300, which are incorporated herein by reference.

Other suitable amplification methods include the ligase chain reaction (LCR) (e.g., Wu and Wallace, Genomics 4, 560 (1989), Landegren et al., Science 241, 1077 (1988) and Barringer et al. Gene 89:117 (1990)), transcription amplification (Kwoh et al., Proc. Natl. Acad. Sci. USA 86, 1173 (1989) and WO88/10315), self sustained sequence replication (Guatelli et al., Proc. Nat. Acad. Sci. USA, 87, 1874 (1990) and WO90/06995), selective amplification of target polynucleotide sequences (U.S. Pat. No. 6,410,276), consensus sequence primed polymerase chain reaction (CP-PCR) (U.S. Pat. No. 4,437,975), arbitrarily primed polymerase chain reaction (AP-PCR) (U.S. Pat. Nos. 5,413,909, 5,861,245) and nucleic acid based sequence amplification (NABSA). (See, U.S. Pat. Nos. 5,409,818, 5,554,517, and 6,063,603, each of which is incorporated herein by reference). Other amplification methods that may be used are described in, U.S. Pat. Nos. 5,242,794, 5,494,810, 4,988,617 and in U.S. Ser. No. 09/854,317, each of which is incorporated herein by reference.

Additional methods of sample preparation and techniques for reducing the complexity of a nucleic sample are described in Dong et al., Genome Research 11, 1418 (2001), in U.S. Pat. Nos. 6,361,947, 6,391,592 and U.S. patent application Ser. Nos. 09/916,135, 09/920,491, 09/910,292, and 10/013,598, which are incorporated herein by reference for all purposes.

Methods for conducting polynucleotide hybridization assays have been well developed in the art. Hybridization assay procedures and conditions will vary depending on the application and are selected in accordance with the general binding methods known including those referred to in: Maniatis et al. Molecular Cloning: A Laboratory Manual (2nd Ed. Cold Spring Harbor, N.Y, 1989); Berger and Kimmel Methods in Enzymology, Vol. 152, Guide to Molecular Cloning Techniques (Academic Press, Inc., San Diego, Calif., 1987); Young and Davism, P.N.A.S, 80: 1194 (1983). Methods and apparatus for carrying out repeated and controlled hybridization reactions have been described in U.S. Pat. Nos. 5,871,928, 5,874,219, 6,045,996 and 6,386,749, 6,391,623 each of which are incorporated herein by reference.

The present invention also contemplates signal detection of hybridization between ligands in certain preferred embodiments. See U.S. Pat. Nos. 5,143,854, 5,578,832; 5,631,734; 5,834,758; 5,936,324; 5,981,956; 6,025,601; 6,141,096; 6,185,030; 6,201,639; 6,218,803; and 6,225,625, in U.S. Patent application 60/364,731 and in PCT Application PCT/US99/06097 (published as WO99/47964), each of which also is hereby incorporated by reference in its entirety for all purposes.

Methods and apparatus for signal detection and processing of intensity data are disclosed in, for example, U.S. Pat. Nos. 5,143,854, 5,547,839, 5,578,832, 5,631,734, 5,800,992, 5,834,758; 5,856,092, 5,902,723, 5,936,324, 5,981,956, 6,025,601, 6,090,555, 6,141,096, 6,185,030, 6,201,639; 6,218,803; and 6,225,625, in U.S. Patent application 60/364,731 and in PCT Application PCT/US99/06097 (published as WO99/47964), each of which also is hereby incorporated by reference in its entirety for all purposes.

The practice of the present invention may also employ conventional biology methods, software and systems. Computer software products of the invention typically include computer readable medium having computer-executable instructions for performing the logic steps of the method of the invention. Suitable computer readable medium include floppy disk, CD-ROM/DVD/DVD-ROM, hard-disk drive, flash memory, ROM/RAM, magnetic tapes and etc. The computer executable instructions may be written in a suitable computer language or combination of several languages. Basic computational biology methods are described in, e.g. Setubal and Meidanis et al., Introduction to Computational Biology Methods (PWS Publishing Company, Boston, 1997); Salzberg, Searles, Kasif, (Ed.), Computational Methods in Molecular Biology, (Elsevier, Amsterdam, 1998); Rashidi and Buehler, Bioinformatics Basics: Application in Biological Science and Medicine (CRC Press, London, 2000) and Ouelette and Bzevanis Bioinformatics: A Practical Guide for Analysis of Gene and Proteins (Wiley & Sons, Inc., 2nd ed., 2001).

The present invention may also make use of various computer program products and software for a variety of purposes, such as probe design, management of data, analysis, and instrument operation. See, U.S. Pat. Nos. 5,593,839, 5,795,716, 5,733,729, 5,974,164, 6,066,454, 6,090,555, 6,185,561, 6,188,783, 6,223,127, 6,229,911 and 6,308,170, which are incorporated herein by reference.

Additionally, the present invention may have preferred embodiments that include methods for providing genetic information over networks such as the Internet as shown in U.S. patent application Ser. Nos. 10/063,559, 60/349,546, 60/376,003, 60/394,574, 60/403,381.

II. Glossary

The following terms are intended to have the following general meanings as used herein.

Nucleic acids according to the present invention may include any polymer or oligomer of pyrimidine and purine bases, preferably cytosine (C), thymine (T), and uracil (U), and adenine (A) and guanine (G), respectively. See Albert L. Lehninger, PRINCIPLES OF BIOCHEMISTRY, at 793–800 (Worth Pub. 1982). Indeed, the present invention contemplates any deoxyribonucleotide, ribonucleotide or peptide nucleic acid component, and any chemical variants thereof, such as methylated, hydroxymethylated or glucosylated forms of these bases, and the like. The polymers or oligomers may be heterogeneous or homogeneous in composition, and may be isolated from naturally occurring sources or may be artificially or synthetically produced. In addition, the nucleic acids may be deoxyribonucleic acid (DNA) or ribonucleic acid (RNA), or a mixture thereof, and may exist permanently or transitionally in single-stranded or double-stranded form, including homoduplex, heteroduplex, and hybrid states.

An "oligonucleotide" or "polynucleotide" is a nucleic acid ranging from at least 2, preferable at least 8, and more preferably at least 20 nucleotides in length or a compound that specifically hybridizes to a polynucleotide. Polynucleotides of the present invention include sequences of deoxyribonucleic acid (DNA) or ribonucleic acid (RNA), which may be isolated from natural sources, recombinantly produced or artificially synthesized and mimetics thereof. A further example of a polynucleotide of the present invention may be peptide nucleic acid (PNA) in which the constituent bases are joined by peptides bonds rather than phosphodiester linkage, as described in Nielsen et al., Science 254: 1497–1500 (1991), Nielsen Curr. Opin. Biotechnol., 10:71–75 (1999). The invention also encompasses situations in which there is a nontraditional base pairing such as Hoogsteen base pairing which has been identified in certain tRNA molecules and postulated to exist in a triple helix. "Polynucleotide" and "oligonucleotide" are used interchangeably in this application.

An "array" is an intentionally created collection of molecules which can be prepared either synthetically or biosynthetically. The molecules in the array can be identical or different from each other. The array can assume a variety of formats, e.g., libraries of soluble molecules; libraries of compounds tethered to resin beads, silica chips, or other solid supports.

A nucleic acid library or array is an intentionally created collection of nucleic acids which can be prepared either synthetically or biosynthetically in a variety of different formats (e.g., libraries of soluble molecules; and libraries of oligonucleotides tethered to resin beads, silica chips, or other solid supports). Additionally, the term "array" is meant to include those libraries of nucleic acids which can be prepared by spotting nucleic acids of essentially any length (e.g., from 1 to about 1000 nucleotide monomers in length) onto a substrate. The term "nucleic acid" as used herein refers to a polymeric form of nucleotides of any length, either ribonucleotides, deoxyribonucleotides or peptide nucleic acids (PNAs), that comprise purine and pyrimidine bases, or other natural, chemically or biochemically modified, non-natural, or derivatized nucleotide bases (see, e.g., U.S. Pat. No. 6,156,501, incorporated herein by reference). The backbone of the polynucleotide can comprise sugars and phosphate groups, as may typically be found in RNA or DNA, or modified or substituted sugar or phosphate groups. A polynucleotide may comprise modified nucleotides, such as methylated nucleotides and nucleotide analogs. The sequence of nucleotides may be interrupted by non-nucleotide components. Thus the terms nucleoside, nucleotide, deoxynucleoside and deoxynucleotide generally include analogs such as those described herein. These analogs are those molecules having some structural features in common with a naturally occurring nucleoside or nucleotide such that when incorporated into a nucleic acid or oligonucleotide sequence, they allow hybridization with a naturally occurring nucleic acid sequence in solution. Typically, these analogs are derived from naturally occurring nucleosides and nucleotides by replacing and/or modifying the base, the ribose or the phosphodiester moiety. The changes can be tailor made to stabilize or destabilize hybrid formation or enhance the specificity of hybridization with a complementary nucleic acid sequence as desired.

"Solid support", "support", and "substrate" are used interchangeably and refer to a material or group of materials having a rigid or semi-rigid surface or surfaces. In many embodiments, at least one surface of the solid support will be substantially flat, although in some embodiments it may be desirable to physically separate synthesis regions for different compounds with, for example, wells, raised regions, pins, etched trenches, or the like. According to other embodiments, the solid support(s) will take the form of beads, resins, gels, microspheres, or other geometric configurations.

Combinatorial Synthesis Strategy: A combinatorial synthesis strategy is an ordered strategy for parallel synthesis of diverse polymer sequences by sequential addition of reagents which may be represented by a reactant matrix and a switch matrix, the product of which is a product matrix. A reactant matrix is a 1 column by m row matrix of the building blocks to be added. The switch matrix is all or a subset of the binary numbers, preferably ordered, between 1 and m arranged in columns. A "binary strategy" is one in which at least two successive steps illuminate a portion, often half, of a region of interest on the substrate. In a binary synthesis strategy, all possible compounds which can be formed from an ordered set of reactants are formed. In most preferred embodiments, binary synthesis refers to a synthesis strategy which also factors a previous addition step. For example, a strategy in which a switch matrix for a masking strategy halves regions that were previously illuminated, illuminating about half of the previously illuminated region and protecting the remaining half (while also protecting about half of previously protected regions and illuminating about half of previously protected regions). It will be recognized that binary rounds may be interspersed with non-binary rounds and that only a portion of a substrate may be subjected to a binary scheme. A combinatorial "masking" strategy is a synthesis which uses light or other spatially selective deprotecting or activating agents to remove protecting groups from materials for addition of other materials such as amino acids. See, e.g., U.S. Pat. No. 5,143,854.

Monomer: refers to any member of the set of molecules that can be joined together to form an oligomer or polymer. The set of monomers useful in the present invention includes, but is not restricted to, for the example of (poly) peptide synthesis, the set of L-amino acids, D-amino acids, or synthetic amino acids. As used herein, "monomer" refers to any member of a basis set for synthesis of an oligomer. For example, dimers of L-amino acids form a basis set of 400 "monomers" for synthesis of polypeptides. Different basis sets of monomers may be used at successive steps in the synthesis of a polymer. The term "monomer" also refers to a chemical subunit that can be combined with a different chemical subunit to form a compound larger than either subunit alone.

Biopolymer or biological polymer: is intended to mean repeating units of biological or chemical moieties. Representative biopolymers include, but are not limited to, nucleic acids, oligonucleotides, amino acids, proteins, peptides, hormones, oligosaccharides, lipids, glycolipids, lipopolysaccharides, phospholipids, synthetic analogues of the foregoing, including, but not limited to, inverted nucleotides, peptide nucleic acids, Meta-DNA, and combinations of the above. "Biopolymer synthesis" is intended to encompass the synthetic production, both organic and inorganic, of a biopolymer.

Related to a biopolymer is a "biomonomer" which is intended to mean a single unit of biopolymer, or a single unit which is not part of a biopolymer. Thus, for example, a nucleotide is a biomonomer within an oligonucleotide biopolymer, and an amino acid is a biomonomer within a protein or peptide biopolymer; avidin, biotin, antibodies, antibody fragments, etc., for example, are also biomonomers. Initiation Biomonomer: or "initiator biomonomer" is meant to indicate the first biomonomer which is covalently attached via reactive nucleophiles to the surface of the polymer, or the first biomonomer which is attached to a linker or spacer arm attached to the polymer, the linker or spacer arm being attached to the polymer via reactive nucleophiles.

Complementary: Refers to the hybridization or base pairing between nucleotides or nucleic acids, such as, for instance, between the two strands of a double stranded DNA molecule or between an oligonucleotide primer and a primer binding site on a single stranded nucleic acid to be sequenced or amplified. Complementary nucleotides are, generally, A and T (or A and U), or C and G. Two single stranded RNA or DNA molecules are said to be complementary when the nucleotides of one strand, optimally aligned and compared and with appropriate nucleotide insertions or deletions, pair with at least about 80% of the nucleotides of the other strand, usually at least about 90% to 95%, and more preferably from about 98 to 100%. Alternatively, complementarity exists when an RNA or DNA strand will hybridize under selective hybridization conditions to its complement. Typically, selective hybridization will occur when there is at least about 65% complementary over a stretch of at least 14 to 25 nucleotides, preferably at least about 75%, more preferably at least about 90% complementary. See, M. Kanehisa Nucleic Acids Res. 12:203 (1984), incorporated herein by reference.

The term "hybridization" refers to the process in which two single-stranded polynucleotides bind non-covalently to form a stable double-stranded polynucleotide. The term "hybridization" may also refer to triple-stranded hybridization. The resulting (usually) double-stranded polynucleotide is a "hybrid." The proportion of the population of polynucleotides that forms stable hybrids is referred to herein as the "degree of hybridization".

Hybridization conditions will typically include salt concentrations of less than about 1M, more usually less than about 500 mM and less than about 200 mM. Hybridization temperatures can be as low as 5° C., but are typically greater than 22° C., more typically greater than about 30° C., and preferably in excess of about 37° C. Hybridizations are usually performed under stringent conditions, i.e. conditions under which a probe will hybridize to its target subsequence. Stringent conditions are sequence-dependent and are different in different circumstances. Longer fragments may require higher hybridization temperatures for specific hybridization. As other factors may affect the stringency of hybridization, including base composition and length of the complementary strands, presence of organic solvents and extent of base mismatching, the combination of parameters is more important than the absolute measure of any one alone. Generally, stringent conditions are selected to be about 5° C. lower than the thermal melting point (Tm) fro the specific sequence at a defined ionic strength and pH. The Tm is the temperature (under defined ionic strength, pH and nucleic acid composition) at which 50% of the probes complementary to the target sequence hybridize to the target sequence at equilibrium.

Typically, stringent conditions include salt concentration of at least 0.01 M to no more than 1 M Na ion concentration (or other salts) at a pH 7.0 to 8.3 and a temperature of at least 25° C. For example, conditions of 5×SSPE (750 mM NaCl, 50 mM NaPhosphate, 5 mM EDTA, pH 7.4) and a temperature of 25–30° C. are suitable for allele-specific probe hybridizations. For stringent conditions, see for example, Sambrook, Fritsche and Maniatis. "Molecular Cloning A laboratory Manual" 2nd Ed. Cold Spring Harbor Press (1989) and Anderson "Nucleic Acid Hybridization" 1st Ed., BIOS Scientific Publishers Limited (1999), which are hereby incorporated by reference in its entirety for all purposes above.

Hybridization probes are nucleic acids (such as oligonucleotides) capable of binding in a base-specific manner to a complementary strand of nucleic acid. Such probes include peptide nucleic acids, as described in Nielsen et al., Science 254:1497–1500 (1991), Nielsen Curr. Opin. Biotechnol., 10:71–75 (1999) and other nucleic acid analogs and nucleic acid mimetics. See U.S. Pat. No. 6,156,501.

Probe: A probe is a molecule that can be recognized by a particular target. In some embodiments, a probe can be surface immobilized. Examples of probes that can be investigated by this invention include, but are not restricted to, agonists and antagonists for cell membrane receptors, toxins and venoms, viral epitopes, hormones (e.g., opioid peptides, steroids, etc.), hormone receptors, peptides, enzymes, enzyme substrates, cofactors, drugs, lectins, sugars, oligonucleotides, nucleic acids, oligosaccharides, proteins, and monoclonal antibodies.

Target: A molecule that has an affinity for a given probe. Targets may be naturally-occurring or man-made molecules. Also, they can be employed in their unaltered state or as aggregates with other species. Targets may be attached, covalently or noncovalently, to a binding member, either directly or via a specific binding substance. Examples of targets which can be employed by this invention include, but are not restricted to, antibodies, cell membrane receptors, monoclonal antibodies and antisera reactive with specific antigenic determinants (such as on viruses, cells or other materials), drugs, oligonucleotides, nucleic acids, peptides, cofactors, lectins, sugars, polysaccharides, cells, cellular membranes, and organelles. Targets are sometimes referred to in the art as anti-probes. As the term targets is used herein, no difference in meaning is intended. A "Probe Target Pair" is formed when two macromolecules have combined through molecular recognition to form a complex.

Ligand: A ligand is a molecule that is recognized by a particular receptor. The agent bound by or reacting with a receptor is called a "ligand," a term which is definitionally meaningful only in terms of its counterpart receptor. The term "ligand" does not imply any particular molecular size or other structural or compositional feature other than that the substance in question is capable of binding or otherwise interacting with the receptor. Also, a ligand may serve either as the natural ligand to which the receptor binds, or as a functional analogue that may act as an agonist or antagonist. Examples of ligands that can be investigated by this invention include, but are not restricted to, agonists and antagonists for cell membrane receptors, toxins and venoms, viral epitopes, hormones (e.g., opiates, steroids, etc.), hormone receptors, peptides, enzymes, enzyme substrates, substrate analogs, transition state analogs, cofactors, drugs, proteins, and antibodies.

Receptor: A molecule that has an affinity for a given ligand. Receptors may be naturally-occurring or manmade molecules. Also, they can be employed in their unaltered state or as aggregates with other species. Receptors may be attached, covalently or noncovalently, to a binding member, either directly or via a specific binding substance. Examples of receptors which can be employed by this invention include, but are not restricted to, antibodies, cell membrane receptors, monoclonal antibodies and antisera reactive with specific antigenic determinants (such as on viruses, cells or other materials), drugs, polynucleotides, nucleic acids, peptides, cofactors, lectins, sugars, polysaccharides, cells, cellular membranes, and organelles. Receptors are sometimes referred to in the art as anti-ligands. As the term receptors is used herein, no difference in meaning is intended. A "Ligand Receptor Pair" is formed when two macromolecules have combined through molecular recognition to form a complex. Other examples of receptors which can be investigated by this invention include but are not restricted to those molecules shown in U.S. Pat. No. 5,143,854, which is hereby incorporated by reference in its entirety.

Effective amount refers to an amount sufficient to induce a desired result.

mRNA or mRNA transcripts: as used herein, include, but not limited to pre-mRNA transcript(s), transcript processing intermediates, mature mRNA(s) ready for translation and transcripts of the gene or genes, or nucleic acids derived from the mRNA transcript(s). Transcript processing may include splicing, editing and degradation. As used herein, a nucleic acid derived from an mRNA transcript refers to a nucleic acid for whose synthesis the mRNA transcript or a subsequence thereof has ultimately served as a template. Thus, a cDNA reverse transcribed from an mRNA, a cRNA transcribed from that cDNA, a DNA amplified from the cDNA, an RNA transcribed from the amplified DNA, etc., are all derived from the mRNA transcript and detection of such derived products is indicative of the presence and/or abundance of the original transcript in a sample. Thus, mRNA derived samples include, but are not limited to, mRNA transcripts of the gene or genes, cDNA reverse transcribed from the mRNA, cRNA transcribed from the cDNA, DNA amplified from the genes, RNA transcribed from amplified DNA, and the like.

A fragment, segment, or DNA segment refers to a portion of a larger DNA polynucleotide or DNA. A polynucleotide, for example, can be broken up, or fragmented into, a plurality of segments. Various methods of fragmenting nucleic acid are well known in the art. These methods may be, for example, either chemical or physical in nature. Chemical fragmentation may include partial degradation with a DNase; partial depurination with acid; the use of restriction enzymes; intron-encoded endonucleases; DNA-based cleavage methods, such as triplex and hybrid formation methods, that rely on the specific hybridization of a nucleic acid segment to localize a cleavage agent to a specific location in the nucleic acid molecule; or other enzymes or compounds which cleave DNA at known or unknown locations. Physical fragmentation methods may involve subjecting the DNA to a high shear rate. High shear rates may be produced, for example, by moving DNA through a chamber or channel with pits or spikes, or forcing the DNA sample through a restricted size flow passage, e.g., an aperture having a cross sectional dimension in the micron or submicron scale. Other physical methods include sonication and nebulization. Combinations of physical and chemical fragmentation methods may likewise be employed such as fragmentation by heat and ion-mediated hydrolysis. See for example, Sambrook et al., "Molecular Cloning: A Laboratory Manual," 3rd Ed. Cold Spring Harbor Laboratory Press, Cold Spring Harbor, N.Y. (2001) ("Sambrook et al.) which is incorporated herein by reference for all purposes. These methods can be optimized to digest a nucleic acid into fragments of a selected size range. Useful size ranges maybe from 100, 200, 400, 700 or 1000 to 500, 800, 1500, 2000, 4000 or 10,000 base pairs. However, larger size ranges such as 4000, 10,000 or 20,000 to 10,000, 20,000 or 500,000 base pairs may also be useful. See, e.g., Dong et al., Genome Research 11, 1418 (2001), in U.S. Pat. Nos. 6,361, 947, 6,391,592, incorporated herein by reference.

A primer is a single-stranded oligonucleotide capable of acting as a point of initiation for template-directed DNA synthesis under suitable conditions e.g., buffer and temperature, in the presence of four different nucleoside triphosphates and an agent for polymerization, such as, for example, DNA or RNA polymerase or reverse transcriptase. The length of the primer, in any given case, depends on, for example, the intended use of the primer, and generally ranges from 15 to 30 nucleotides. Short primer molecules generally require cooler temperatures to form sufficiently stable hybrid complexes with the template. A primer need not reflect the exact sequence of the template but must be sufficiently complementary to hybridize with such template. The primer site is the area of the template to which a primer hybridizes. The primer pair is a set of primers including a 5' upstream primer that hybridizes with the 5' end of the sequence to be amplified and a 3' downstream primer that hybridizes with the complement of the 3' end of the sequence to be amplified.

A genome is all the genetic material of an organism. In some instances, the term genome may refer to the chromosomal DNA. Genome may be multichromosomal such that the DNA is cellularly distributed among a plurality of individual chromosomes. For example, in human there are 22 pairs of chromosomes plus a gender associated XX or XY pair. DNA derived from the genetic material in the chromosomes of a particular organism is genomic DNA. The term genome may also refer to genetic materials from organisms that do not have chromosomal structure. In addition, the term genome may refer to mitochondria DNA. A genomic library is a collection of DNA fragments represents the whole or a portion of a genome. Frequently, a genomic libarry is a collection of clones made from a set of randomly generated, sometimes overlapping DNA fragments representing the entire genome or a portion of the genome of an organism.

An allele refers to one specific form of a genetic sequence (such as a gene) within a cell or within a population, the specific form differing from other forms of the same gene in the sequence of at least one, and frequently more than one, variant sites within the sequence of the gene. The sequences at these variant sites that differ between different alleles are termed "variances", "polymorphisms", or "mutations".

At each autosomal specific chromosomal location or "locus" an individual possesses two alleles, one inherited from the father and one from the mother. An individual is "heterozygous" at a locus if it has two different alleles at that locus. An individual is "homozygous" at a locus if it has two identical alleles at that locus.

Polymorphism refers to the occurrence of two or more genetically determined alternative sequences or alleles in a population. A polymorphic marker or site is the locus at which divergence occurs. Preferred markers have at least two alleles, each occurring at frequency of greater than 1%, and more preferably greater than 10% or 20% of a selected population. A polymorphism may comprise one or more base changes, an insertion, a repeat, or a deletion. A polymorphic locus may be as small as one base pair. Polymorphic markers include restriction fragment length polymorphisms, variable number of tandem repeats (VNTR's), hypervariable regions, minisatellites, dinucleotide repeats, trinucleotide repeats, tetranucleotide repeats, simple sequence repeats, and insertion elements such as Alu. The first identified allelic form is arbitrarily designated as the reference form and other allelic forms are designated as alternative or variant alleles. The allelic form occurring most frequently in a selected population is sometimes referred to as the wildtype form. Diploid organisms may be homozygous or heterozygous for allelic forms. A diallelic polymorphism has two forms. A triallelic polymorphism has three forms. Single nucleotide polymorphisms (SNPs) are included in polymorphisms.

Single nucleotide polymorphism (SNPs) are positions at which two alternative bases occur at appreciable frequency (>1%) in the human population, and are the most common type of human genetic variation. The site is usually preceded by and followed by highly conserved sequences of the allele (e.g., sequences that vary in less than 1/100 or 1/1000 members of the populations). A single nucleotide polymorphism usually arises due to substitution of one nucleotide for another at the polymorphic site. A transition is the replacement of one purine by another purine or one pyrimidine by another pyrimidine. A transversion is the replacement of a purine by a pyrimidine or vice versa. Single nucleotide polymorphisms can also arise from a deletion of a nucleotide or an insertion of a nucleotide relative to a reference allele.

Genotyping refers to the determination of the genetic information an individual carries at one or more positions in the genome. For example, genotyping may comprise the determination of which allele or alleles an individual carries for a single SNP or the determination of which allele or alleles an individual carries for a plurality of SNPs. A genotype may be the identity of the alleles present in an individual at one or more polymorphic sites.

Linkage disequilibrium or allelic association means the preferential association of a particular allele or genetic marker with a specific allele, or genetic marker at a nearby chromosomal location more frequently than expected by chance for any particular allele frequency in the population. For example, if locus X has alleles a and b, which occur equally frequently, and linked locus Y has alleles c and d, which occur equally frequently, one would expect the combination ac to occur with a frequency of 0.25. If ac occurs more frequently, then alleles a and c are in linkage disequilibrium. Linkage disequilibrium may result from natural selection of certain combination of alleles or because an allele has been introduced into a population too recently to have reached equilibrium with linked alleles. A marker in linkage disequilibrium can be particularly useful in detecting susceptibility to disease (or other phenotype) notwithstanding that the marker does not cause the disease. For example, a marker (X) that is not itself a causative element of a disease, but which is in linkage disequilibrium with a gene (including regulatory sequences) (Y) that is a causative element of a phenotype, can be detected to indicate susceptibility to the disease in circumstances in which the gene Y may not have been identified or may not be readily detectable.

III. Synthesis of Polymer Arrays

In one aspect of the invention, methods are provided for producing polymer arrays. For the purpose of describing the invention, oligonucleotide array production is used as an example in the specification. However, one of skill in the art would appreciate that the methods can also be used to make other polymer arrays such as peptide arrays.

A substrate is provided for the synthesis of polymers. The substrate can be made of any suitable materials, such as glass, metal, composite materials, etc. In many embodiments, at least one surface of the substrate will be substantially flat, although in some embodiments it may be desirable to physically separate synthesis regions for different polymers with, for example, wells, raised regions, etched trenches, or the like. In some embodiments, the substrate itself contains wells, trenches, flow through regions, etc. which form all or part of the synthesis regions. According to other-embodiments, small beads may be provided on the surface, and compounds synthesized thereon optionally may be released upon completion of the synthesis. Substrates are well known in the art and are readily commercially available through vendors such as USPG, PPG Industries, AFG Industries and others.

Surfaces on the solid substrate will usually, though not always, be composed of the same material as the substrate. Thus, the surface may be composed of any of a wide variety of materials, for example, polymers, plastics, resins, polysaccharides, silica or silica-based materials, carbon, metals, inorganic glasses, membranes, or any of the above-listed substrate materials. In some embodiments the surface may provide for the use of caged binding members which are attached firmly to the surface of the substrate. Preferably, the surface will contain reactive groups, which could be carboxyl, amino, hydroxyl, or the like. Most preferably, the surface will have surface Si—OH functionalities, such as are found on silica surfaces. For synthesis of polynucleotides by phosphoramidite chemistry, a linker consisting of (—COCH2CH2CONHCH2CH2CH2-siloxane bond-glass substrate) may be used to attach to a DMT-protected nucleoside via formation of a carboxyl bond to the 3' hydroxyl of the nucleoside.

The substrate may include a surface with a layer of linker (or spacer) molecules thereon. The linker molecules are preferably of sufficient length to permit polymers in a completed substrate to interact freely with molecules exposed to the substrate. The linker molecules may be, for example, aryl acetylene, ethylene glycol oligomers containing 2–10 monomer units, diamines, diacids, amino acids, among others, and combinations thereof. Alternatively, the linkers may be the same molecule type as that being synthesized (i.e., nascent polymers), such as oligonucleotides or oligopeptides. In a preferred embodiment, the linker molecules are PEG linker. Of course, the type of linker molecules used depends upon the particular application. The linker molecules can be attached to the substrate via carbon-carbon bonds using, for example, (poly)trifluorochloroethylene surfaces, or preferably, by siloxane bonds (using, for example, glass or silicon oxide surfaces). Siloxane bonds with the surface of the substrate may be formed in one embodiment via reactions of linker molecules bearing trichlorosilyl groups. The linker molecules may optionally be attached in an ordered array, i.e., as parts of the head groups. In alternative embodiments, the linker molecules are absorbed to the surface of the substrate. The linker molecules or substrate itself and monomers used herein are provided with a functional group to which is bound a protective group. Preferably, the protective group is on the distal or terminal end of the linker molecule opposite the substrate. The protective group may be either a negative protective group (i.e., the protective group renders the linker molecules less reactive with a monomer upon exposure) or a positive protective group (i.e., the protective group renders the linker molecules more reactive with a monomer upon exposure).

In the case of negative protective groups an additional step of reactivation may be required. In some embodiments, this can be performed by heating. For an extensive listing of protective groups useful in the practice of the present invention, see also Greene, T. W. and Wuts, P. G. M., Protective Groups in Organic Synthesis, (1991), incorporated herein by reference in its entirety for all purposes. Useful representative acid sensitive protective groups include dimethoxytrityl (DMT), tert-butylcarbamate (tBoc) and trifluoroacetyl (Tfa). Useful representative base sensitive protective groups include 9-fluorenylmethoxycarbonyl (Fmoc), isobutyrl (iBu), benzoyl (Bz) and phenoxyacetyl (pac). Other protective groups include acetamidomethyl, acetyl, tert-amyloxycarbonyl, benzyl, benzyloxycarbonyl, 2-(4-biphenylyl)-2-propyloxycarbonyl, 2-bromobenzyloxycarbonyl, tert-butyl, tert-butyloxycarbonyl, 1-carbobenzoxamido-2,2,2-trifluoroethyl, 2,6-dichlorobenzyl, 2-(3,5-dimethoxyphenyl)-2-propyloxycarbonyl, 2,4-dinitrophenyl, dithiasuccinyl, formyl, 4-ethoxybenzenesulfonyl, 4-methoxybenzyl, 4-methylbenzyl, o-nitrophenylsulfenyl, 2-phenyl-2-propyloxycarbonyl, .alpha.-2,4,5-tetramethylbenzyloxycarbonyl, p-toluenesulfonyl, xanthenyl, benzyl ester, N-hydroxysuccinimide ester, p-nitrobenzyl ester, p-nitrophenyl ester, phenyl ester, p-nitrocarbonate, p-nitrobenzylcarbonate, trimethylsilyl and pentachlorophenyl ester and the like.

In a preferred embodiment, planar glass substrates are covalently modified with a silane reagent to provide a uniform layer of covalently bonded hydroxyalkyl groups on which oligonucleotide synthesis can be initiated. A photoimagable layer is added by extending these synthesis sites with a poly(ethylene oxide) linker which has a terminal protecting group.

The substrate is then coated with a layer of suitable photosensitive materials.

One of skill in the art would appreciate that appropriate coating of photoresist may be dependent on several different factors. For example, coating method surface cleanliness and preparation—relates to wetting and flow of the coating solution and coating solution: viscosity, solvent system, wetting, surface tension (leveling agents) may affect the coating process.

A variety of coating methods may be employed for at least some embodiments of the invention.

1) Spin Coating: The resist material is puddled onto the center of the substrate, then spun at a high rpm to spread it over the substrate surface.

2) Spray Coating: Some spray coating systems are capable of producing highly uniform coatings of thicknesses ranging from less than 1000 Angstroms to greater than 100 microns. In the spray coating process, there is direct perpendicular impingement of the coating solution that promotes coverage into deep trenches. For thicker films, the solutions used in spray coating are often diluted as compared to solutions used to achieve a similar spin-coated film thickness.

3) Meniscus Coating: In this process, a substrate is inverted and passed over a laminar flow of coating material.

4) Roller, Curtain and Extrusion Coating: These are all variations of directly applying the coating solution across the topside of the substrate. There is no forced drying during coating other than evaporation, therefore, the coating material has time to flow and planarize over surface features.

5) Plasma-Deposited Photoresist: (Ionic Systems, Inc.) This system is capable of depositing relatively thin coatings (<0.5 microns), but the coatings are very conformal over topography.

6) Electrophoretic (electrodeposited) Photoresist: Both positive and negative resist chemistries are available.

Once the substrate is coated with the photosensitive materials, it can be exposed. The pattern of the exposure is determined based upon which monomer or polymer to add to the specific locations of the substrate.

Figure 1:
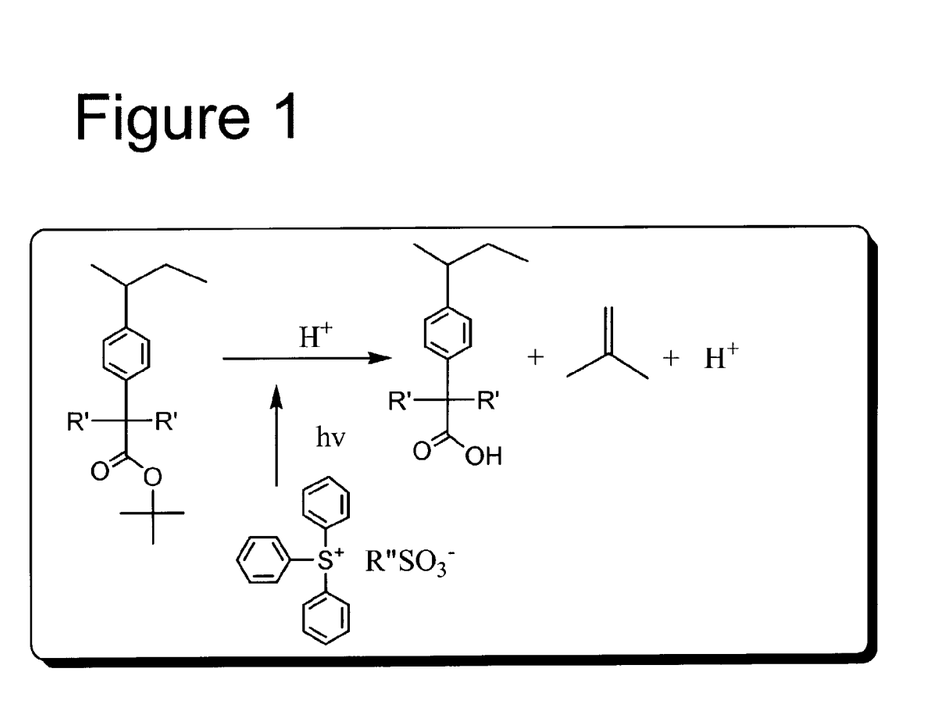
FIG. 1 shows an exemplary reactive polymer and photoacid generator system.
Figure 2:
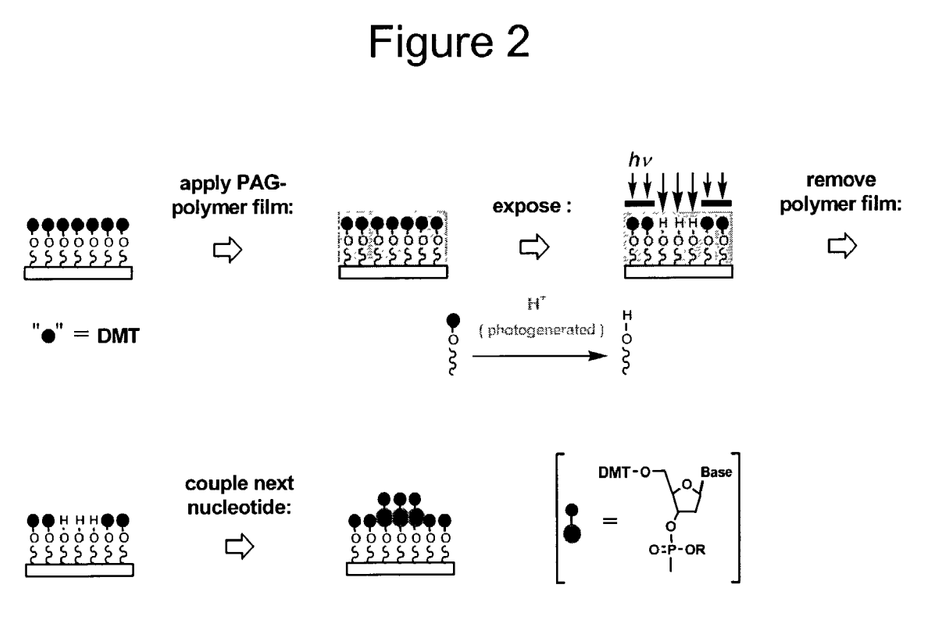
FIG. 2 shows an exemplary photodirected synthesis of polymers using photoacid generator.

In one aspect of the invention, a system of a reactive polymer matrix and a photoacid generator (PAG) is used for the synthesis of polymer arrays (FIG. 1). In preferred embodiments, low PAG loading (5% wt.) is used. The active polymer provides the amplification mechanism. The PAG/polymer system will deprotect DMT without causing significant depurination. The process dose not need separate development and deprotection steps, which simplifies resist based photodirected synthesis (FIG. 2).

The photoacid generator (PAG) is photosensitive towards light at different wavelengths by having different structures, and it includes but not limited to, covalent and ionic structures. On the positions close to the carboxylic carbon, preferably at the α-position, different chemical function groups can be introduced in order to have desired pKa for the acid being generated. In addition to providing support, the reactive polymer contains functional groups that will generate greater amount of acid, in a catalysis fashion, which is similar to the chemical amplification mechanism used in photoresist. Similar to the photoacid generator (PAG), the reactive polymer matrix system can generate acids with desired pKa, by having different chemical function groups at the positions close to the acid group, preferably at the α-position.

Preferably, the photoacid generator (PAG) chosen for a particular synthesis strategy does not unduly interfere with subsequent or previous synthesis steps in the formation of the polymer. Surprisingly, the method of the present invention advantageously allows the use of photocatalysts or products of photocatalysts that can be detrimental in known methods of synthesizing polymer arrays. For example, some PAGs produce strong acids that cause significant depurination and thus could not be used directly for polynucleotide synthesis. However, the method of the present invention allows the use of these types of PAGs that produce strong acids since only small amounts of the PAGs are needed and accordingly only a small amount of strong acid is produced. Another important consideration is the radiation sensitivity of the various compounds employed.

One preferred class of PAGs include PAGs such as naphthoquinone diazide sulfonic acids such as those disclosed by Kosar, Light Sensitive Systems, John Wiley & Sons, 1965, pp. 343 to 352, incorporated herein by reference in its entirety for all purposes. These PAGs form an acid in response to radiation of different wavelengths ranging from visible to X-ray. Preferred PAGs include the 2, 1, 4 diazonaphthoquinone sulfonic acid esters and the 2,1,5-diazonaphthoquinone sulfonic acid esters. Other useful PAGs include the family of nitrobenzyl esters, and the s-triazine derivatives. Suitable s-triazine acid generators are disclosed, for example, in U.S. Pat. No. 4,189,323, incorporated herein by reference. Non-ionic PAACs including halogenated non-ionic, photoacid generating compounds such as, for example, 1,1-bis[p-chorophenyl]-2,2,2-trichloroethane (DDT); 1,1-bis[p-methoxyphenyl]-2,2,2-trichloroethane; 1,2,5,6,9,10-hexabromocyclododecane; 1,10-dibromodecane; 1,1-bis[p-chlorophenyl]-2,2-dichloroethane;

4,4dichloro-2-(trichloromethyl)benzhydrol (Kelthane); hexachlorodimethyl sulfone; 2-chloro-6-(trichloromethyl) pyridine; o,o-diethyl-o-(3,5,6-trichloro-2-pyridyl)phosphorothionate; 1,2,3,4,5,6 hexachlorocyclohexane; N(1,1-bis[p-chlorophenyl]-2,2,2 trichloroethyl)acetamide; tris[2,3-dibromopropyl]isocyanurate; 2,2-bis[p-chlorophenyl]-1,1dichloroethylene; tris[trichloromethyl]striazine; and their isomers, analogs, homologs, and residual compounds are also suitable for some applications. Suitable PAGs are also disclosed in European Patent Application Nos. 0164248 and 0232972, both incorporated by reference for all purposes. PAGs that are particularly preferred for deep UV exposure include 1,1-bis(p-chlorophenyl)-2,2,2-trichloroethane (DDT); 1,1-bis(p-methoxyphenol)-2,2,2,-trichloroethane; 1,1-bis(chlorophenyl)-2,2,2-trichloroethanol; tris(1,2,3-methanesulfonyl)benzene; and tris(trichloromethyl)triazine. Also more deep UV PAGs useful in the practice of the present invention include sulfonyl and carbonyl diazomethane compounds. Such suitable PAGs are disclosed in U.S. Pat. Nos. 6,090,518, 5,945,248, 5,340,682, and 5,338,641, incorporated herein by reference.

Onium salts are preferred for some embodiments as PAGs. When synthesizing polynucleotide arrays, a radiation sensitizer is employed to shift the radiation sensitivity of the onium salts away from wavelengths damaging to the starting materials. Suitable radiation sensitizers for use with onium salts or other PAGs are well known in the art and include benzophenone, thiophene, fluorene, anthraquinone, quinoline, phenanthracene, flavone, micheler's ketone, chrysene, anthracene, eosin and the like. It is to be understood that additional sensitizers are well known to those skilled in the art and are readily identifiable based upon the present disclosure.

Examples of onium salts useful in the present invention include those having halogen (i.e. I, Br, Cl etc.) complex anions of divalent to heptavalent metals or non-metals, for example, Sb, Sn, Fe, Bi, Al, Ga, In, Ti, Zr, Sc, Cl, Cr, Hf, and Cu as well as B, P, and As. Examples of suitable onium salts are diaryl-diazonium salts and onium salts of group VI and VII of the Periodic Table, for example, halonium salts, quaternary ammonium, phosphonium and arsonium salts, aromatic sulfonium salts and sulfoxonium salts or seleonium salts. Examples of suitable preferred onium salts can be found in U.S. Pat. Nos. 4,442,197; 4,603,101; and 4,624,912, all incorporated herein by reference. Sulfonium analogs can be prepared using Group VI elements such as O, S, Se, Te. Onium analogs can be prepared by using Group VII elements such as I, Br, and Cl. For a review on onium salts as photoacid generators, see Pappas, J Imaging Technology (1985), 11,146, incorporated herein by reference. Another group of suitable acid generators is the family of sulfonated esters including sulfonyloxy ketones. Suitable sulfonated esters have been reported in J. of Photopolymer Science and Technology (1991), 4, 3, 337–340, incorporated herein by reference, including benzoin tosylate, t-butylphenyl alpha-(p-toluenesulfonyloxy)-acetate, and t-butyl alpha-(p-toluenesulfonyloxy)-acetate. Both ionic, including di-tert-butylphenyl iodonium triflate (TBI-T), di-tertbutylphenliodonium caimphorsulfonate (TBI-CAM) and di-tert-butylphenyl iodonium dichloracetate (TBI-DCA), and nonionic, including napthalimidotriftete and phthalimidotosylate or mixture of those photoacids are useful in the present invention. Useful PACs within the scope of the present invention include:

$R_2$—$R_5$ = alkyl, CN, NO2, O-alkyl, H, OH, NH2, N(alkyl)2

Alkyl refers to saturated or unsaturated, straight chain or branched, carbon atoms having from 1 to 50 carbons, preferably from 1 to 30 carbon atoms and more preferably from 1 to 10 carbon atoms. Aromatic groups include straight chain or cyclic aromatics, substituted or unsubstituted having from 1 to 50 carbons, preferably from 1 to 30 carbon atoms and more preferably from 1 to 10 carbon atoms. One preferred PAC for polynucleotide synthesis is the o-nitrobenzyl ester of toluenesulfonic acid, such as the 2-nitro-3,4-dimethoxbenzyl tosylate having the structure:

When irradiated, the ester produces catalytic amounts of p-toluenesulfonic acid. Other PAGs useful in the practice of the present invention include the following:

where R is sulfonate, tosylate, mesolate, $PF_6^-$ or $BF_4^-$ with or without the presence of a sensitizer of the formula:

The reactive polymers contain the acid-labile functional groups that will generate greater amount of acid, in a catalysis fashion, which is similar to the chemical amplification mechanism used in photoresist. Preferred reactive polymers for use in the present invention may contain both phenolic and non-phenolic units, and either of them. For example, one preferred group of such polymers has acid labile groups substantially, essentially or completely only on non-phenolic units of the polymer. One preferred polymer binder has repeating units of x and y of the following formula, in a relative basis x content could go as low as 0%, and y could go as high as 100%:

Where the hydroxyl group may be present at either the ortho, meta or para positions throughout the polymer, and R is substituted or unsubstituted alkyl having 1 to about 18 carbon atoms, more typically 1 to about 6 to 8 carbon atoms. Tert-butyl is a generally preferred R group. An R group may be optionally substituted by e.g. one or more halogen (particularly F, Cl, or Br). The depicted phenolic units of the polymer also may be optionally substituted by such groups. The units x and y may be regularly alternating in the polymer, or may be randomly interspersed through the polymer.

Additional preferred reactive polymers have acid labile groups on both phenolic and non-phenolic units of the polymer. One preferred polymer binder has repeating units of x and y of the following formula, in a relative basis b content could go as low as 0%, and a could go as high as 100%:

Where R group is a photoacid labile group as defined above for the other preferred polymer, R' is an alkyl oxycarbonyl group at either the ortho, meta, or para positions, with substituted or unsubstituted alkyl having 1 to about 18 carbon atoms, more typically 1 to about 6 to 8 carbon atoms. Tert-butyl is a generally preferred alkyl group in R' group. Both R and R' groups may be optionally substituted by e.g. one or more halogen (particularly F, Cl, or Br). The depicted phenolic units of the polymer also may be optionally substituted by such groups. The units a and b may be regularly alternating in the polymer, or may be randomly interspersed through the polymer.

Polymer and photoacid generator and other components if necessary, can be formulated and applied to the substrate by deposition, spin coat or other methods to form a thin layer. The subsequent exposure under irradiation will generate acid with desired pKa, which will react with biological substances on the substrate (such as a linker, a nucleotide or an oligonucleotide), while in the unexposed area there is no photoreaction. The reaction will create the reaction sites for future derivatization reactions, in the exposed area by positive-tone mechanism, or in the unexposed area by the negative-tone mechanism. This method offers the advantage of disconnecting the photochemistry reaction site from biological substances, and can have more flexibility to apply different chemistry and with greater ease, which in turn will improve throughput, and further improve optical resolution.

The selection of radiation sources is based upon the sensitivity spectrum of the photoacid generator (PAG) and reactive polymer, potential damage to synthesis substrates, intermediates, or products is also considered. In some preferred embodiments, the radiation could be ultraviolet (UV), infrared (IR), or visible light. In a specific embodiment, the radiation source is a light beam with a wavelength in the range of from 190–500 nm, preferably from 250–450 nm, more preferably from 365–400 nm. Specific radiation wavelengths include 193 nm, 254 nm, 313 nm, 340 nm, 365 nm, 396 nm, 413 nm, 436 nm, and 500 nm. Suitable light sources include high pressure mercury arc lamps and are readily commercially available from Oriel, OAI, Cannon, A,B Manufacturing.

There are a number of mask based and maskless methods for exposing photoresists. The mask is typically made of a glass or polyester film with a patterned emulsion or metal film on one side. The mask is aligned with the substrate so that the pattern can be placed correctly on the substrate. The visible areas of photoresist are then exposed through the mask using a light source with appropriate intensity. The typical intensity for i-line resist is around 100–400 mJ/cm₂, and the typical intensity for DUV resist is below 100 mJ/cm².

There are three main types of exposure methods; contact, proximity and projection. Contact brings the mask and the substrate in to physical contact. Proximity exposure bring the mask close to, but not in contact with the substrate. Some resolution is lost, but the risk of damage is reduced. Projection uses a lens system to project the mask pattern onto the substrate. This image can be stepped and repeated over the entire surface.

Maskless exposure can be performed using a variety of methods in the art. For example, patterned light can be generated using digitally controlled micromirrors (U.S. Pat. No. 6,271,957, incorporated herein by reference for all purposes).

The acid being generated from the system should have desired pKa to cleave the acid-labile protective groups on the polymer arrays manufactured. A subsequent strip step by using organic solvent should take the coating layer off the substrate, and a monomer layer is synthesized. The stripping solvents used here include but not limited to, acetone, dimethyl sulfoxide, and acetonitrile. By doing so, a separate acid-cleavage step could be avoided from the process.

Once a monomer layer is synthesized, additional monomers can be added in a similar way to produce desired polymers in intended locations. The process can be repeated to produce polymers of desired length.

Polymer arrays manufactured according to the methods of the invention has extensive practical applications. For example, high density probe arrays made with the methods of the invention can be used to detect the expression of a large number of genes. In some embodiments, the high density probe arrays can be used to detect alternatively spliced mRNAs. The high density probe arrays can also be used to detect all transcripts of a genome. Gene expression profiling (detection of a large number of genes) can be employed for drug candidate identification, confirmation, toxicological evaluation, etc. Gene expression profiling has also been used for medical diagnostics, toxicological and pharmacogenomic applications.

Polymer array manufactured according to the methods of the invention may also be used to determine the genotypes of an individual. For example, high density oligonucleotide probe arrays can be used to detect 1000, 10,000, 100,000 or more SNPs in a single assay. High density oligonucleotides are also used to resequence DNAs. Commercial high density oligonucleotide probe arrays from Affymetrix (Santa Clara, Calif.), for example, have been used to resequence regions of the genome with high accuracy. Resequence arrays have also been used to resequence the human genome to discover SNP hapotypes.

It is to be understood that the above description is intended to be illustrative and not restrictive. Many variations of the invention will be apparent to those of skill in the art upon reviewing the above description. All cited references, including patent and non-patent literature, are incorporated herein by reference in their entireties for all purposes.

What is claimed is:

1. A method for making polymer arrays comprising:
 a) Coating a substrate with a reactive polymer matrix and a photo carboxylic acid generator; wherein the reactive polymer has the structure of:

wherein R is substituted or unsubstituted alkyl having 1 to about 18 carbon atoms;
wherein x and y are repeating units of the structure;
 b) exposing the substrate with patterned radiation to remove acid labile protecting group in reaction areas;
 c) coupling a monomer into the reaction areas, wherein the monomer is a nucleotide.

2. A method for making polymer arrays comprising:
 a) Coating a substrate with a reactive polymer matrix and a photo carboxylic acid generator; wherein the reactive polymer has the structure of:

wherein R is substituted or unsubstituted alkyl having 1 to about 18 carbon atoms;
wherein x and y are repeating units of the structure;
 b) exposing the substrate with patterned radiation to remove acid labile protecting group in reaction areas;
 c) coupling a monomer into the reaction areas; wherein the monomer is an amino acid.

3. A method for making polymer arrays comprising:
 a) Coating a substrate with a reactive polymer matrix and a photo carboxylic acid generator; wherein the reactive polymer has the structure of:

wherein R is substituted or unsubstituted alkyl having 1 to about 18 carbon atoms;
wherein x and y are repeating units of the structure, wherein the hydroxyl group is present at either the ortho, meta or para positions throughout the polymer and wherein the R group is substituted by one or more halogen;
 b) exposing the substrate with patterned radiation to remove acid labile protecting group in reaction areas;
 c) coupling a monomer into the reaction areas.

4. The method of claim 3 wherein the phenolic units of the polymer is substituted by one or more halogen.

5. A method of making polymer arrays comprising:
 a) coating a substrate with a reactive polymer matrix and a photo carboxylic acid generator; wherein the reactive polymer has the structure of:

wherein R is substituted or unsubstituted alkyl having 1 to about 18 carbon atoms, and wherein R is substituted by one or more halogens;

wherein R' is substituted or unsubstituted alkyl oxycarbonyl located at either the ortho, meta, or para positions; and wherein x and y are repeating units of the structure;

b) exposing the substrate with patterned radiation to remove acid labile protecting group in reaction areas;

c) coupling a monomer into the reaction areas.

6. A method of making polymer arrays comprising:

a) coating a substrate with a reactive polymer matrix and a photo carboxylic acid generator; wherein the reactive polymer has the structure of:

wherein R is substituted or unsubstituted alkyl having 1 to about 18 carbon atoms;

wherein R' is substituted or unsubstituted alkyl oxycarbonyl located at either the ortho, meta, or para positions and wherein R' is substituted by one of more halogens; and wherein x and y are repeating units of the structure;

b) exposing the substrate with patterned radiation to remove acid labile protecting group in reaction areas;

c) coupling a monomer into the reaction areas.

7. A method of making polymer arrays comprising:

a) coating a substrate with a reactive polymer matrix and a photo carboxylic acid generator; wherein the reactive polymer has the structure of:

wherein R is substituted or unsubstituted alkyl having 1 to about 18 carbon atoms;

wherein R' is substituted or unsubstituted alkyl oxycarbonyl located at either the ortho, meta, or para positions;

wherein x and y are repeating units of the structure; and wherein the phenolic unit of the polymer is substituted by one or more halogen;

b) exposing the substrate with patterned radiation to remove acid labile protecting group in reaction areas;

c) coupling a monomer into the reaction areas.

* * * * *